United States Patent
Kohli et al.

(10) Patent No.: US 9,147,453 B2
(45) Date of Patent: Sep. 29, 2015

(54) PROGRAMMABLE DELAY INTRODUCING CIRCUIT IN SELF TIMED MEMORY

(71) Applicant: STMICROELECTRONICS INTERNATIONAL N.V., Amsterdam (NL)

(72) Inventors: Nishu Kohli, Noida (IN); Mudit Bhargava, Noida (IN); Shishir Kumar, Greater Noida (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

(21) Appl. No.: 14/532,174

(22) Filed: Nov. 4, 2014

(65) Prior Publication Data

US 2015/0055400 A1     Feb. 26, 2015

Related U.S. Application Data

(62) Division of application No. 13/412,306, filed on Mar. 5, 2012, which is a division of application No. 11/617,286, filed on Dec. 28, 2006, now Pat. No. 8,138,455.

(30) Foreign Application Priority Data

Dec. 30, 2005    (IN) ........................... 3546/DEL/2005

(51) Int. Cl.
| | |
|---|---|
| H05B 1/02 | (2006.01) |
| G11C 7/22 | (2006.01) |
| G11C 7/06 | (2006.01) |
| G11C 7/08 | (2006.01) |
| G11C 29/12 | (2006.01) |

(Continued)

(52) U.S. Cl.
CPC *G11C 7/227* (2013.01); *G11C 7/06* (2013.01); *G11C 7/08* (2013.01); *G11C 7/22* (2013.01); *G11C 7/222* (2013.01); *G11C 29/12015* (2013.01); *G11C 29/14* (2013.01); *G11C 29/50* (2013.01); *G11C 29/50012* (2013.01)

(58) Field of Classification Search
CPC ...... H05B 1/0225; G11C 7/222; G11C 7/227; G11C 7/06; G11C 29/14; G11C 29/50012
USPC ................... 219/492, 507, 508, 494; 365/194
See application file for complete search history.

(56) References Cited

U.S. PATENT DOCUMENTS

| | | |
|---|---|---|
| 4,312,025 A | 1/1982 | Boyer |
| 4,894,791 A | 1/1990 | Jiang et al. |
| 5,210,236 A | 5/1993 | Takayanagi |

(Continued)

*Primary Examiner* — Mark Paschall
(74) *Attorney, Agent, or Firm* — Allen, Dyer, Doppelt, Milbrath & Gilchrist, P.A.

(57) ABSTRACT

Delays are introduced in self-timed memories by introducing a capacitance on the path of a signal to be delayed. The capacitances are realized by using idle-lying metal layers in the circuitry. The signal to be delayed is connected to the idle-lying capacitances via programmable switches. The amount of delay introduced depends on the capacitance introduced in the path of signal, which in turn depends on state of the switches. The state of the switches is controlled by delay codes provided externally to the delay introducing circuitry. Since idle-lying metal capacitances are utilized, the circuitry can be implemented using a minimum amount of additional hardware. Also, the delay provided by the circuitry is a function of memory cell SPICE characteristics and core parasitic capacitances.

17 Claims, 4 Drawing Sheets

(51) Int. Cl.
*G11C 29/14* (2006.01)
*G11C 29/50* (2006.01)

(56) References Cited

U.S. PATENT DOCUMENTS

| | | |
|---|---|---|
| 5,511,031 A | 4/1996 | Grover et al. |
| 6,011,713 A | 1/2000 | Yamane et al. |
| 6,034,548 A | 3/2000 | Churcher et al. |
| 6,343,039 B2 | 1/2002 | Agawa et al. |
| 6,885,610 B2 | 4/2005 | Takayanagi |
| 7,219,269 B2 | 5/2007 | Frisch |
| 8,242,828 B1 | 8/2012 | Mai |
| 2001/0043102 A1 | 11/2001 | Kuge |
| 2003/0085744 A1 | 5/2003 | Heo et al. |
| 2003/0200509 A1 | 10/2003 | Takabayashi et al. |
| 2005/0028050 A1 | 2/2005 | Ganry |

PROGRAMMABLE DELAY INTRODUCING CIRCUIT IN SELF TIMED MEMORY

FIELD OF THE INVENTION

The present invention relates to the field of self-timed memories, and more particularly, to a method and circuit for providing delay codes in a self-timed memory.

BACKGROUND OF THE INVENTION

A semiconductor memory is composed of data storage cells arranged in rows and columns. At the time of reading from or writing into a memory, a set of external control signals and clocks are activated. The memory cells from which the data is to be read/written are accessed and then the data is read (or written) by the read (or write) circuitry. The read circuitry performs the reading operation by sensing the voltage difference developed across the bit lines (or data lines).

To ensure that desired data is read correctly, the read operation at the sense amplifier should be triggered only when sufficient voltage differential has been developed across the bit lines. This is done by ensuring a time delay between accessing a memory cell and triggering the amplifier. This time delay is also known as the memory cell discharge time. The circuitry providing this delay is called the self-timing circuitry. The self-timing circuitry should provide delay, which ensures correct reading of the memory cells. This circuitry generates a RESET signal, which produces the sense amplifier enable signal to enable the sense amplifier to sample the voltage difference across the corresponding bit lines.

In a self-timed memory array, the timing delay of a RESET signal is matched to the timing delay of the bit lines of the memory array by deriving the timing of RESET signal from a group of cells called reference cells. These reference cells have a structure identical to that of normal memory cells, and as a result, the delay in generation of the sense amplifier enable signal matches the timing delay of the bit lines.

Self-timing circuitry has now become an integral part of almost all memories designed these days. However, in certain situations a need arises for delays in a memory that can be controlled externally. This is achieved by incorporating programmable delay circuitry within a memory device. The use of programmable delay circuitry provides flexibility in selecting among multiple delay intervals depending upon circuit operation conditions or other requirements.

Programmable delay code circuitry is useful during testing of a memory at speeds different from the normal one. At the time of testing, if a device fails to perform at high operation speed, it must be tested at a slower operational speed. This is done by delaying the trigger to the sense amplifier using the programmable delay code circuitry. Programmable delay circuitry may also be used during the actual implementation of a memory device to improve the performance or yield of the device.

Different configurations of programmable delay circuitry have been used in integrated circuits till date. In one of the configurations presently used (as disclosed by U.S. Pat. No. 6,034,548 issued to Churcher et al.), the programmable delay circuit includes a signal path, a delay circuit having a plurality of delay values, a switching circuit connected to the signal path and the delay circuit for switching a selected delay value into the signal path, and a memory programmable after fabrication of the integrated circuit for storage of data which controls the switching circuit and hence the delay value switched into the signal path. The programmable memory in the integrated circuit is programmed with a code known as a delay code. This delay code represents the delay interval to be selected out of different possible delay intervals. Depending upon the delay code, a delay value is switched into the signal path.

In another configuration (as disclosed by U.S. Pat. No. 6,885,610 B2 issued to Takayanagi) a number of delayed versions of a signal are generated by a plurality of delay circuits. A programmable multiplexer or selector circuit selects among available delay options. The selector circuit is controlled by values stored in a control register, which are in turn controlled by test control signals presented to the programmable delay circuit. Thus, the delay introduced in a signal can be altered by altering the test control signals Although, the above-mentioned techniques provide an efficient means of programming delays in an integrated circuit, however, both these methods require a extra devices in the circuitry. As a result, extra hardware is needed especially when the delay spectrum required is large.

Moreover, the circuitry used in the prior art provides a delay, which is a function of logic SPICE characteristics only. However, in general, the memory cell SPICE may be different from the SPICE of the periphery logic devices. As a result, there may be a differential shift in the SPICE characteristics of these two models. Hence a delay provided by pure logic devices may not be sufficient when there are changes in memory cell SPICE characteristics.

Also, any significant change in the extractions of parasitic capacitances of the bit lines results in a change in the voltage differential that gets developed across them. The delay introduced by the programming delays, however, is not affected by a change in the extractions of parasitic capacitances of the bit lines.

Also, the above mention techniques provide the same delay for a memory with a smaller number of rows as well as for a larger number of rows. However, in general, a cut with a larger number of rows needs a larger delay than that one with a smaller number of rows to generate the same voltage differential, which is sufficient for a correct evaluation by the sense amplifier. The techniques disclosed by the prior art provide a fixed delay sufficient for cuts with all row combinations. This results in performance deterioration.

Therefore, there arises a need for delay introducing circuitry, which uses less hardware and provides delays that are a function of memory cell SPICE characteristics and core parasitic capacitances. Also, the delay should be dependent on the size of the memory.

SUMMARY OF THE INVENTION

An object of the present invention is to provide a programmable delay introducing circuitry in self-timed memories, which is implemented using less hardware.

Another object of the present invention is to provide delay introducing circuitry that introduces a delay in a sense amplifier enable signal that is a function of memory cell SPICE characteristics and the core parasitic capacitances.

The above-mentioned objects of the present invention are achieved by providing a method of introducing delays in self-timed memories, wherein the delays are introduced by providing a capacitance on the path of the RESET signal. The capacitances are realized by using idle-lying metal layers in the circuit. The RESET signal or another signal in its path may be connected to these idle-lying capacitances via programmable switches.

The reference bit line may be a good candidate for this programmable connection to the capacitances. The RESET signal produces a sense enable signal to enable sense amplifiers. Therefore, delay introduced in triggering of the sense amplifiers may depend on the delay introduced in the RESET signal. This delay depends on the capacitance introduced in the path of the signal, which in turn depends on a state of the switches. The state of the switches may be controlled by delay codes provided externally to the delay introducing circuitry.

Since idle-lying metal capacitances are utilized, extra hardware is not required. Thus, in the configuration as disclosed by the present invention, there is minimal area overhead in an area required only for the switches used and the switch control signals generation in the circuitry.

Moreover, the delay provided by the proposed circuitry may be a function of the memory cell SPICE characteristics and core parasitic capacitances. As a result, the delay codes cover a large spectrum of delays of interest.

Another feature of the proposed circuitry is that it provides a delay that increases with the number of rows of a cut. A cut with larger number of rows needs a larger delay than that with a smaller number of rows to generate the same voltage differential, which is sufficient for a correct evaluation by the sense amplifier. Hence, the circuit provided by the present invention performs intelligent adaptation of delays with the number of rows in the cut.

DETAILED DESCRIPTION OF THE PREFERRED EMBODIMENTS

Figure 1:
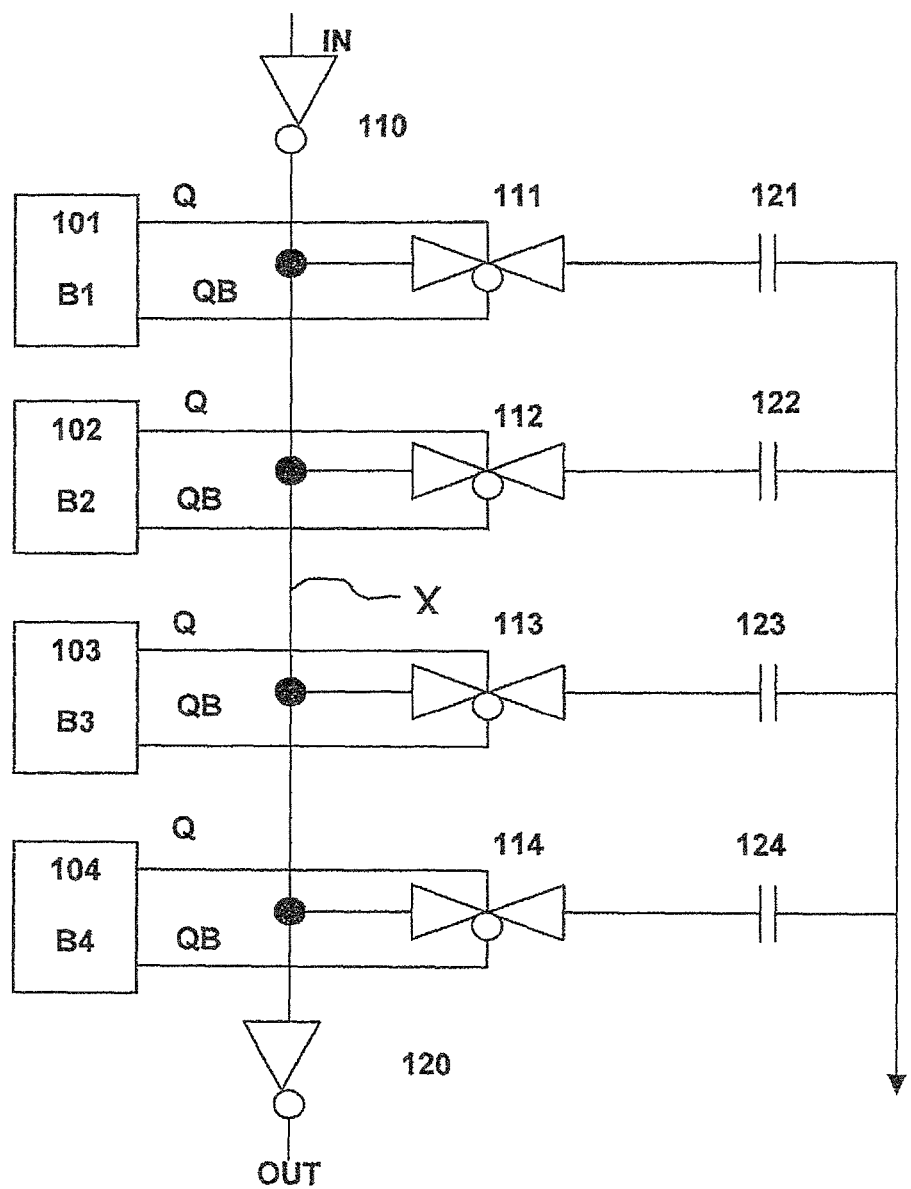
FIG. 1 shows a block diagram of a typical programmable delay element according to the prior art.

FIG. 1 shows a block diagram of a programmable delay element as used in the field. The circuit comprises memory cells (101), (102), (103) and (104) which are loaded with bits B1, B2, B3 and B4. An inverter (110) drives internal node X. Capacitors (121), (122), (123) and (124) are connected to node X via transmission gates (111), (112), (113) and (114). The capacitors (121), (122), (123) and (124) have capacitances C1, C2, C3 and C4. The transmission gates (111), (112), (113) and (114) are controlled by memory cells (101), (102), (103) and (104) respectively. The Q output terminals of the memory cells (101), (102), (103) and (104) are coupled to the gates of the NMOS transistors of the transmission gates (111), (112), (113) and (114) respectively. The QB output terminals of the memory cells (101), (102), (103) and (104) are coupled to the gates of the PMOS transistors of transmission gates (111), (112), (113) and (114) respectively.

A transmission gate is on if there is logic 1 stored in the corresponding memory cell. Therefore, a bit pattern 1100 is stored in memory cells (101), (102), (103) and (104) respectively, turns on transmission gates (111) and (112) and turns off transmission gates (113) and (114). The load seen by the inverter (110) on node X is thus determined by capacitance values of capacitors (121) and (122). Therefore, the load seen by the inverter (110) can be varied by altering the bit pattern in the memory cells (101), (102), (103) and (104).

The load added to node X has the largest value equal to C1+C2+C3+C4 when the memory cells are programmed to 1111 and the lowest value is equal to zero when the memory cells are programmed to 0000. Therefore, in the present configuration, the load seen by the inverter (110) is changed by programming appropriate bit patterns in the memory cells. This in turn alters the propagation delay of a signal flowing from inverter (110) to inverter (120).

Figure 2:
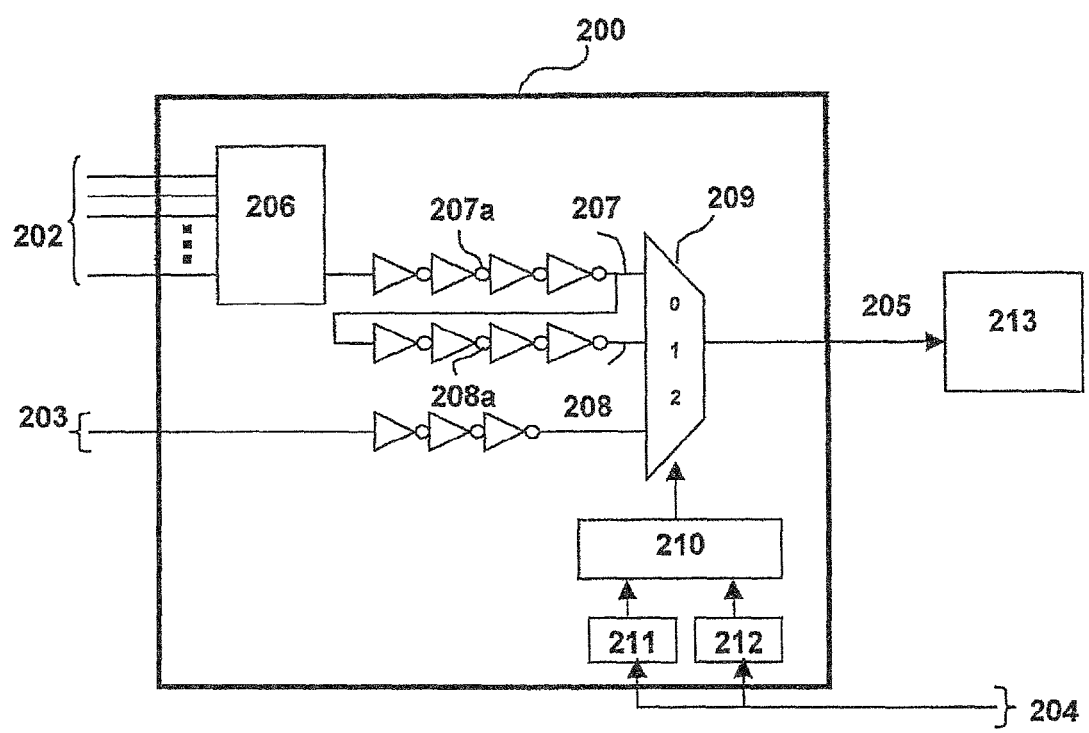
FIG. 2 shows another known configuration of a programmable delay element according to the prior art.

FIG. 2 shows a block diagram of another known configuration of a programmable delay circuit. The programmable delay circuit (200) receives as inputs the precode signal (202) generated by an address precode circuitry (not shown in the diagram) and the clock signal (203). In addition to these, test control signals (204) are also received as inputs to the programmable delay circuit (200).

In response to these signals, the programmable delay circuit (200) generates an output signal. This output signal could be a sense amplifier enable signal or a RESET signal which produces a trigger to enable sense amplifiers. Each of the plurality of predecode signals (202) is coupled as an input to a logic circuit (206). The output from the logic circuit (206) is connected to a multipath delay generator for generating delayed versions of the output signal.

These multiple delayed versions are generated using a first plurality of inverters (207a) to generate a first delayed signal (207), and a second plurality of inverters (208a) coupled in series with the first plurality of inverters to generate a second delayed signal (208). Each of the delay signal versions (207), (208) are input to a multiplexer (209). The function of the multiplexer (209) is to select one signal from various delayed versions (207, 208 etc.).

In addition to the delayed signals (207),(208) the output of logic circuit (206) may also be coupled directly as an additional input to multiplexer (209) to be available for selection as an output. The multiplexer (209) selects the appropriate delay from the various delay options presented as inputs to it. The appropriate signal selection by the multiplexer (209) is controlled by selection logic (210). This selection logic receives the values stored in control registers (211) and (212). These control registers are controlled by test control signals (204). Therefore, the delay introduced by the programmable delay circuit is controlled by the test control signals (204).

Figure 3:
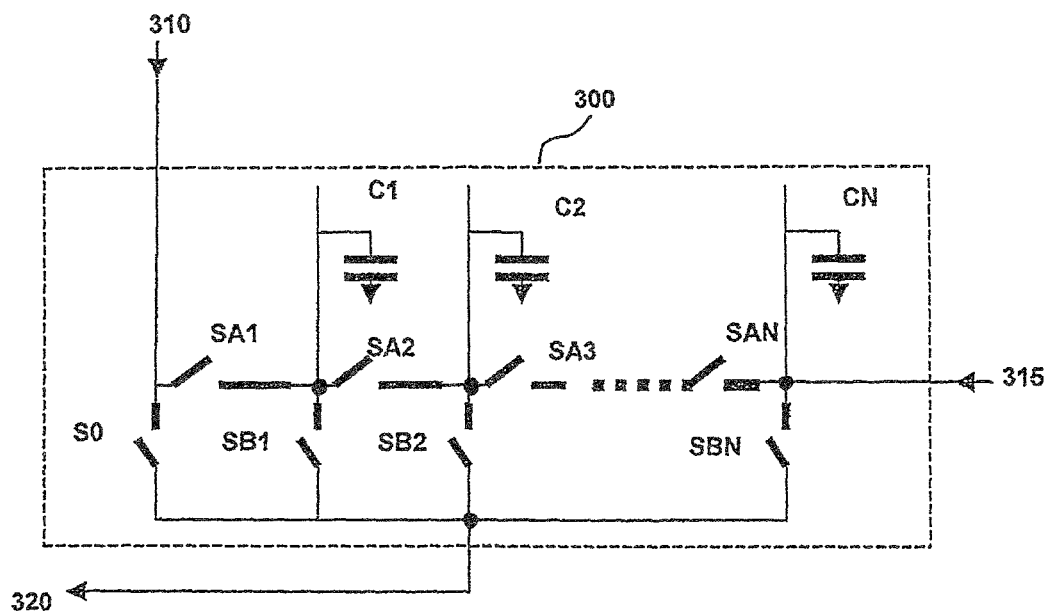
FIG. 3 shows a configuration of a programmable delay introducing circuit according to the present invention.

FIG. 3 shows a detailed block diagram of programmable delay introducing circuitry as disclosed by the present invention. A delay in RESET signal is introduced by introducing a capacitance on the signal path. The RESET signal (310) acts as an input to delay introducing circuitry (300), which gives an output signal (320). The output signal (320) is the delayed version of the input RESET signal.

Delay introducing circuit (300) comprises an array of capacitors C1, C2, C3 ... CN as shown in FIG. 3. Each of these capacitors has a pair of switches associated with it. SA1, SA2, SA3 ... SAN and SB1, SB2, SB3 ... SBN are the two sets of switches. Note that although N capacitors are provided in this embodiment, the actual implementation of the delay element can be varied in different embodiments without departing from the scope of the invention. Apart from these two sets of switches, a switch S0 is also provided in the circuit as shown in FIG. 3. The state of the switches in the delay introducing circuitry is controlled by delay codes (315) applied externally to the circuit.

Whenever any pair of switches is switched on by the delay codes, the capacitor associated with that pair of switches is introduced in the path of the input RESET signal. For example, in the circuit shown in FIG. 3, if switch S0 is on whereas SA1 and SB1, SB2, SB3 ... SBN are all off then the input signal (310) as well as the output signal (320) see no capacitances in their path. As a result, no extra delay is introduced in the input signal (310) and the output signal (320) is delayed a minimum from the input signal.

In case when the delay codes (315) are such that switches SA1 and S0 are on whereas SA2, SB1, SB2 . . . SBN are off then capacitance C1 is introduced in the path of the input signal. This introduces a delay in the input signal as a result of which the output signal (320) is a delayed version of the input signal (310). The delay introduced in the input signal is proportional to the capacitance of capacitor C1. Similarly, if the switches SA1- and SA2 are on, then capacitors C1 and C2 are introduced in the path of input signal and a delay proportional to capacitance C1+C2 is introduced. When switches SA1 and SA2 are on, various combinations of switches S0, SB1 and SB2 introduce different delays in the input signal.

In the circuit shown in FIG. 3, many delayed versions of the input signal can be generated. When all the switches except S0 are switched off, no capacitance is introduced in the input signal path. Thus, in this state, a minimum delay is introduced in the signal. A maximum delay is introduced when all the switches SA1, SA2 . . . SAN and SBN are switched on and S0, SB1 . . . SB(N−1) are off. In this state, a maximum capacitance equal to C1+C2+ . . . +CN is introduced to the input signal path. Also, the input signal (310) has to pass through all the switches SA1, SA2 . . . SAN and SBN to generate the output (320). This results in introduction of a maximum delay in the input signal. Therefore, the delay can be varied from minimum to the maximum value by altering the state of the switches in the circuit by the delay codes (315).

The capacitors used in the circuit disclosed by the present invention are realized in a novel way. This is explained with reference to FIG. 4. In general, self-timed memories have a reference column incorporated into it to track the memory discharge behavior. However, for perfect functioning of self-timing circuitry, the reference column should see the same environment (and same capacitance) as seen by the normal memory cell column. For this purpose, a complete or half-column of memory cells is provided on both sides of the reference column to provide the periphery similar to that seen by the actual memory cell. One or more columns corresponding to the write self-timing circuit may also be present in the circuit. These extra columns usually have unused metal layers. In the circuit disclosed by the present invention, these unused metal layers are used to realize capacitances C1, C2 . . . CN.

Figure 4:
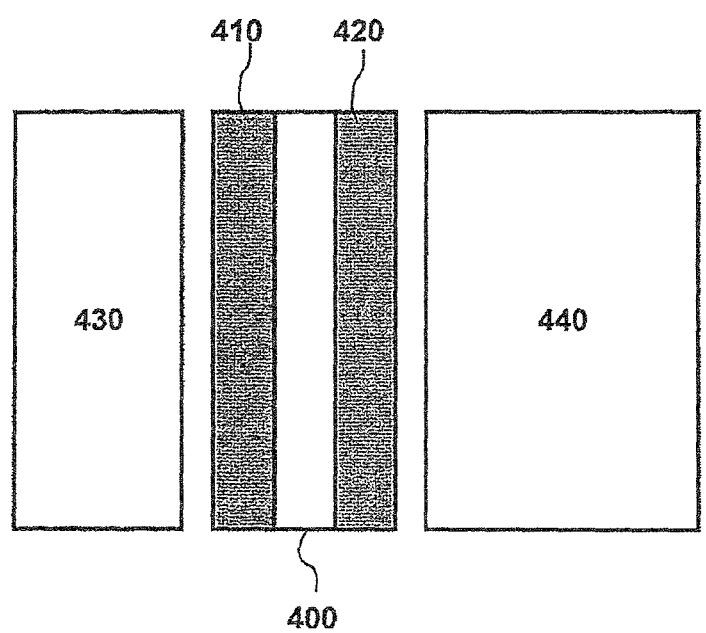
FIG. 4 shows a structure of a typical memory array according to the present invention.

As shown in FIG. 4, a reference column (400) is surrounded by normal memory cell columns (410) and (420). The metal layers in columns (410) and (420) are utilized to realize capacitances. In another configuration of the present invention, metal layers running over any adjacent block are used. For example, generally a word line decoder block (430) is placed just adjacent to the reference column on one side and actual memory core (440) on the other as shown in FIG. 4. The word line decoder block (430) has a word line driver placed just next to the reference column. Metal layers over these drivers are used to realize capacitances. This configuration is useful in cases where extra columns are not available or the extra columns do not provide a sufficient number of metal layers.

Since the method utilizes idle-lying metal layers, there is a minimal area overhead in an area required only for the switches that are used in the circuitry. As a result, the disclosed circuit requires less hardware as compared to the delay introducing elements used in the prior art.

Another advantage of realizing capacitance from unused metal rails of an adjacent memory cell column is that the delay introduced in the RESET signal is a function of memory cell SPICE characteristics and the memory core parasitic capacitances. Therefore, the amount of maximum delay, minimum delay etc. that is determined by the delay code applied, changes dynamically with changes in the memory cell SPICE or extraction values. As a result, this configuration covers a larger spectrum of delays of interest, especially when the requirements of the delay change are due to the change in the memory cell SPICE characteristics or new extractions of parasitic capacitances or both.

Moreover, since the circuit of the present invention adapts to the delay provided, it means that the delay that needs to be provided in CAD (where a differential shift in SPICE or a change in extractions is not considered) to ensure an equal margin in a worst-case scenario on silicon, is less than what is required in the circuitries used by the prior art.

That which is claimed:

1. A method for introducing a programmable delay in a memory device comprising a plurality of conducting layers and at least one capacitor in a path of a signal to be delayed and being formed in a portion of the plurality of conducting layers, the method comprising:
   controlling the at least one capacitor being in the path of the signal to be delayed using at least one switch coupled to the at least one capacitor, with a signal introducing the programmable delay passing through the at least one switch; and
   controlling a state of the at least one switch based upon a selection signal.

2. The method according to claim 1, wherein the memory device further comprises memory cell columns and a reference column; and wherein the portion of the conducting layers defining the at least one capacitor is part of the memory cell columns.

3. The method according to claim 1, wherein the memory device further comprises a plurality of word line drivers adjacent a reference column; and wherein the portion of the conducting layers defining the at least one capacitor is over the plurality of word line drivers.

4. The method according to claim 1, wherein the memory device further comprises a word line driver in a word line decoder adjacent a reference column; and wherein the portion of the conducting layers defining the at least one capacitor is over the word line driver.

5. The method according to claim 1, wherein the memory device further comprises at least one sense amplifier; and wherein the signal to be delayed comprises a RESET signal that produces a sense enable signal to enable the at least one sense amplifier.

6. The method according to claim 1, wherein the selection signal comprises an externally generated selection signal.

7. A method for introducing a programmable delay in a memory device comprising a plurality of conducting layers and at least one capacitor formed in a portion of the plurality of conducting layers, the method comprising:
   controlling the at least one capacitor being in a path of a signal to be delayed using at least one switch coupled to the at least one capacitor, the at least one switch also being in the path of the signal to be delayed, with a signal introducing the programmable delay passing through the at least one switch; and
   controlling a state of the at least one switch based upon an external selection signal.

8. The method according to claim 7, wherein the memory device further comprises memory cell columns and a reference column; and wherein the portion of the conducting layers defining the at least one capacitor is part of the memory cell columns.

9. The method according to claim 7, wherein the memory device further comprises a plurality of word line drivers adjacent a reference column; and wherein the portion of the conducting layers defining the at least one capacitor is over the plurality of word line drivers.

10. The method according to claim 7, wherein the memory device further comprises a word line driver in a word line decoder adjacent a reference column; and wherein the portion of the conducting layers defining the at least one capacitor is over the word line driver.

11. The method according to claim 7, wherein the memory device further comprises at least one sense amplifier; and wherein the signal to be delayed comprises a RESET signal that produces a sense enable signal to enable the at least one sense amplifier.

12. The method according to claim 7, wherein the selection signal comprises an externally generated selection signal.

13. A method for introducing a programmable delay in a memory device comprising a plurality of conducting layers and at least one capacitor being formed in a portion of the plurality of conducting layers, the method comprising:
controlling the at least one capacitor being in a path of a signal to be delayed using at least one switch coupled to the at least one capacitor, the at least one switch also being in the path of the signal to be delayed, with a signal introducing the programmable delay passing through the at least one switch; and
controlling a state of the at least one switch based upon a selection signal.

14. The method according to claim 13, wherein the memory device further comprises memory cell columns and a reference column; and wherein the portion of the conducting layers defining the at least one capacitor is part of the memory cell columns.

15. The method according to claim 13, wherein the memory device further comprises a plurality of word line drivers adjacent a reference column; and wherein the portion of the conducting layers defining the at least one capacitor is over the plurality of word line drivers.

16. The method according to claim 13, wherein the memory device further comprises a word line driver in a word line decoder adjacent a reference column; and wherein the portion of the conducting layers defining the at least one capacitor is over the word line driver.

17. The method according to claim 13, wherein the memory device further comprises at least one sense amplifier; and wherein the signal to be delayed comprises a RESET signal that produces a sense enable signal to enable the at least one sense amplifier.

* * * * *